(12) United States Patent
Cheng et al.

(10) Patent No.: US 7,676,729 B2
(45) Date of Patent: Mar. 9, 2010

(54) DATA CORRUPTION AVOIDANCE IN DRAM CHIP SPARING

(75) Inventors: Charles Cheng, San Jose, CA (US); Robert E. Cypher, Saratoga, CA (US); Michael W. Parkin, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 868 days.

(21) Appl. No.: 11/508,758

(22) Filed: Aug. 23, 2006

(65) Prior Publication Data
US 2008/0052600 A1 Feb. 28, 2008

(51) Int. Cl.
*G11C 29/00* (2006.01)
(52) U.S. Cl. ..................................................... 714/767
(58) Field of Classification Search ................. 714/763, 714/764, 767; 711/100–103, 162
See application file for complete search history.

(56) References Cited

U.S. PATENT DOCUMENTS

| | | | |
|---|---|---|---|
| 3,868,632 A | 2/1975 | Hong | |
| 4,608,687 A * | 8/1986 | Dutton | 714/710 |
| 4,646,312 A | 2/1987 | Goldsbury | |
| 5,081,626 A | 1/1992 | Scott | |
| 5,276,834 A * | 1/1994 | Mauritz et al. | 711/162 |
| 5,745,508 A | 4/1998 | Prohofsky | |
| 5,872,798 A | 2/1999 | Baggen | |
| 6,035,432 A * | 3/2000 | Jeddeloh | 714/763 |
| 6,480,982 B1* | 11/2002 | Chan et al. | 714/764 |
| 6,973,613 B2 | 12/2005 | Cypher | |
| 7,020,811 B2 | 3/2006 | Byrd | |
| 7,103,824 B2 | 9/2006 | Halford | |
| 7,188,296 B1 | 3/2007 | Cypher | |
| 7,257,666 B2* | 8/2007 | Komatsu et al. | 711/103 |
| 7,530,008 B2 | 5/2009 | Das | |

* cited by examiner

*Primary Examiner*—Shelly A Chase
(74) *Attorney, Agent, or Firm*—Rory D. Rankin; Meyertons Hood Kivlin Kowert & Goetzel, P.C.

(57) ABSTRACT

A memory controller, system, and methods are disclosed. The system comprises a memory controller interconnected to a plurality of memory chips. Each memory chip stores data at a plurality of locations. The memory controller performs a sparing transaction comprising reading data from a given location of one or more of the memory chips including a first memory chip, writing the data to a given location of one or more of the memory chips including a second memory chip, wherein during writing, data from the first memory chip is written to the second memory chip, and allowing additional memory transactions directed to the memory chips between the start of reading and the end of writing unless the additional memory transaction is targeted to the given location. In a further embodiment, the sparing transaction comprises correcting errors in the data before writing the data.

20 Claims, 6 Drawing Sheets

DATA CORRUPTION AVOIDANCE IN DRAM CHIP SPARING

BACKGROUND OF THE INVENTION

1. Field of the Invention

This invention relates to computer memory systems and, more particularly, to techniques for avoiding data corruption during sparing of memory chips.

2. Description of the Related Art

Evolving standards of reliability, availability, and serviceability for computer memory systems have led to systems that include one or more redundant memory chips. In such systems, when failures from a particular memory chip exceed a threshold, a spare chip may be employed to take the place of the failed chip. This strategy, referred to as chip sparing, allows a multi-chip system to tolerate more than one failed memory chip by sparing out one known bad chip with a high number of failures and using error-correcting code (ECC) checking and correction to carry on without interruption when failures occur on other chips.

A sparing operation typically includes sequentially reading the contents of a failed chip, applying error correction, and writing the corrected values to the spare chip. A simple approach to preventing data corruption is to stop other memory transactions during a sparing operation. However, stopping other memory transactions during a sparing operation may adversely affect system performance since chip sparing may take a significant amount of time to write-back the corrected contents of an entire chip. For example, to spare a DDR-533 512 Mb DRAM may take approximately 4 seconds. On the other hand, allowing a mixture of chip sparing transactions and other memory transactions could lead to data corruption. For example, when a non-sparing memory write to a given location occurs in between a read and a write of a chip sparing read/write pair to the same location (i.e. after the read but before the write), the data in the given location may be corrupted because the chip sparing write operation may overwrite the data written by the non-sparing write operation. Also, when a non-sparing memory write is issued to a given location that has been spared, data may be written to both the given location and to a corresponding spared location. In addition, a non-sparing memory read operation that takes place during a chip sparing operation to the same location may return different data depending on whether the read takes place before or after the chip sparing write-back. Accordingly, a system and method are needed that avoid data corruption during chip sparing operations while maintaining adequate system performance.

SUMMARY OF THE INVENTION

Various embodiments of a memory controller, system, and methods are disclosed. In one embodiment, a system comprises a memory controller interconnected to a plurality of memory chips. Each memory chip is configured to store data at a plurality of locations. The memory controller is configured to perform a sparing transaction comprising reading data from a given location of one or more of the plurality of memory chips including a first memory chip, writing the data read from the given location of the one or more of the plurality of memory chips including a first memory chip to the given location of one or more of the plurality of memory chips including a second memory chip, wherein during said writing, data from the first memory chip is written to the second memory chip, and allowing additional memory transactions directed to the plurality of memory chips between the start of reading and the end of writing unless the additional memory transaction is targeted to the given location. In a further embodiment, the sparing transaction comprises correcting errors in the data prior to said writing the data.

In a still further embodiment, the memory controller is configured to perform a sparing process comprising sequentially performing a sparing transaction for each of the plurality of locations of the plurality of memory chips. In a still further embodiment, the memory controller is configured to allow additional memory transactions directed to the plurality of memory chips for a configurable period of time after a just completed writing and before starting a subsequent sparing transaction.

Figure 1:
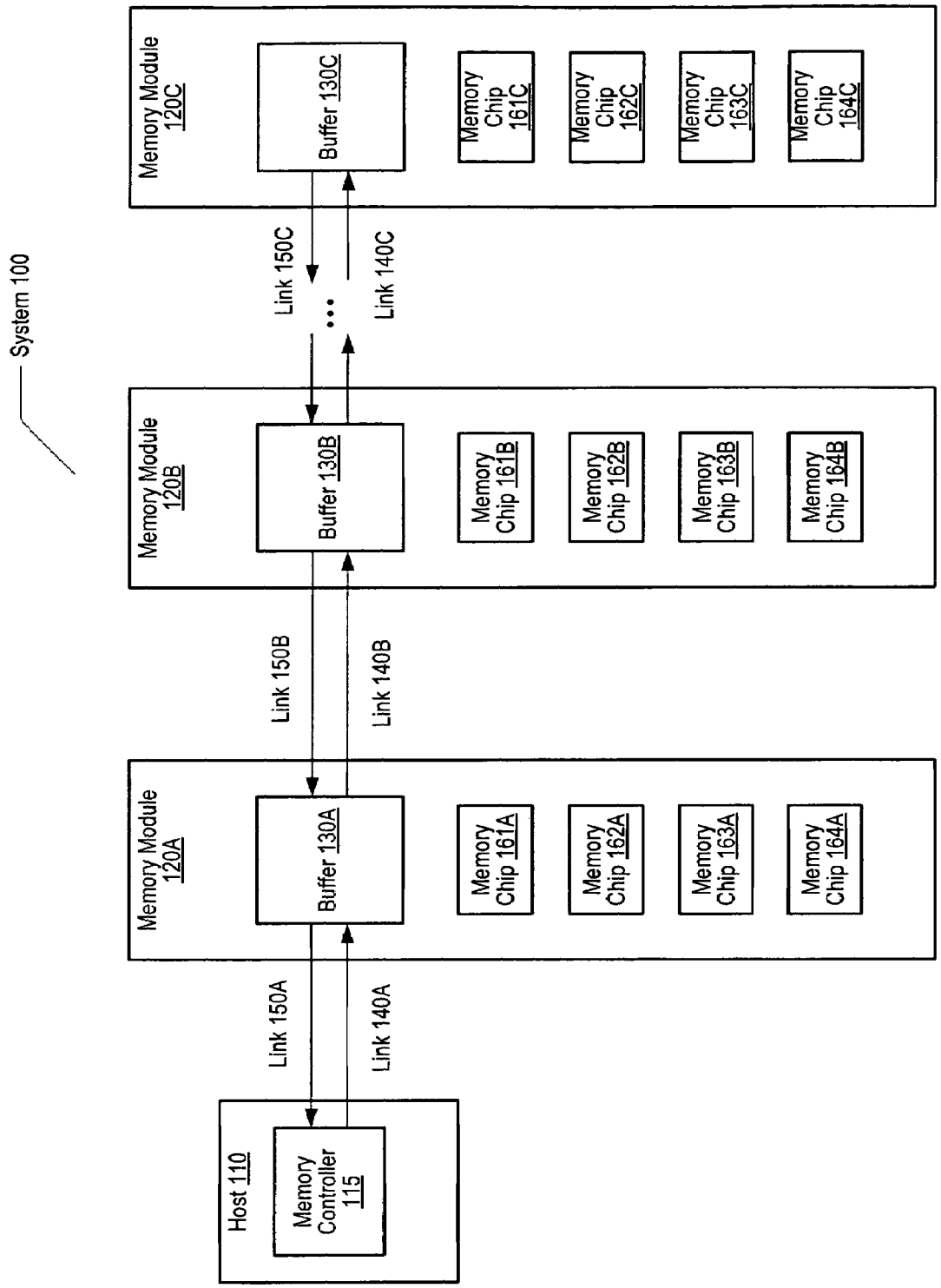
FIG. 1 is a generalized block diagram of one embodiment of a computer memory system.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 is a generalized block diagram of one embodiment of a computer memory system 100 including a host 110 and one or more memory modules 120A-120C. In the discussions that follow, elements designated by a number followed by a letter may be referred to collectively using the number alone. For example, memory modules 120A-120C may be referred to collectively as memory modules 120. In the illustrated embodiment, host 110 may be a processor that includes a memory controller 115. In an alternative embodiment, a processor and a memory controller may be separate elements of host 110.

In one embodiment, each of memory modules 120 may be a fully buffered dual inline memory module (FB-DIMM) that includes a respective buffer 130A-130C. Each of buffers 130 may provide an interface between an array of memory chips and other FB-DIMMs or host 110 within system 100. For example, memory module 120A may include memory chips 161A-164A, etc. In one embodiment, memory chips 161A-164A, etc may be DRAM devices. The JEDEC Solid State Technology Association has published a draft specification for FB-DIMMs. The JEDEC FB-DIMM specification includes descriptions of the operation of a compliant memory module including the characteristics of buffers, the memory devices that populate memory modules, and the interconnection architecture of FB-DIMMs in a memory system. For example, buffers 130 may comply with an Advanced Memory Buffer (AMB) specification that is included in the FB-DIMM specification. Another aspect of the current FB-DIMM specification requires that an FB-DIMM-compliant memory module may be populated with double data rate 2 synchronous dynamic random access memory (DDRII SDRAM) devices. Alternatively, and/or in future revisions of the JEDEC Specification, FB-DIMMs that support other DRAM technologies such as DDR3 are possible and are contemplated.

In one embodiment, memory modules 120 and memory controller 115 may be interconnected via a number of serial links. For example, memory controller 115 may be coupled to buffer 130A through a bi-directional pair of links 140A and 150A that comply with the section of the JEDEC FB-DIMM specification that covers interconnection of memory modules. Additional links 140B and 150B may interconnect buffers 130A and 130B and so on, forming a daisy-chain. Topologies other than a daisy-chain are possible as well. Each of links 140 and 150 may comprise a set of parallel lanes. Although only three memory modules 120 are illustrated in FIG. 1, more or less than three memory modules may be interconnected in the daisy-chain. For example, the JEDEC FB-DIMM specification describes support for up to eight memory modules in the daisy-chain, with each module including one or two memory ranks. A memory rank may be defined as a set of memory devices that are accessed by a single chip select signal. Consequently, according to the FB-DIMM specification there may be from 1 to 16 individually addressable ranks of memory accessible to memory controller 115. Accordingly, in FB-DIMM-compliant embodiments, system 100 may include from one to sixteen memory ranks. In alternative embodiments, system 100 may include any number of memory ranks, including more than sixteen memory ranks.

In alternatives to the illustrated embodiment, memory modules 120 may be connected to memory controller 115 through a variety of interconnect architectures including one or more parallel buses, one or more serial buses, a switch, or other conventional technologies for connecting storage devices to a host. As used herein, a memory chip may be any of a variety of devices that may be accessed for writing or reading stored data. Memory chips may include various forms of dynamic random access memory (DRAM) of any type, such as asynchronous DRAM, SDRAM, RDRAM, DDR SDRAM, etc. Alternatively, a memory chip may include static RAM (SRAM), flash memory, etc. Although twelve memory chips are shown, system 100 may include more or fewer than twelve memory chips 130.

Figure 2:
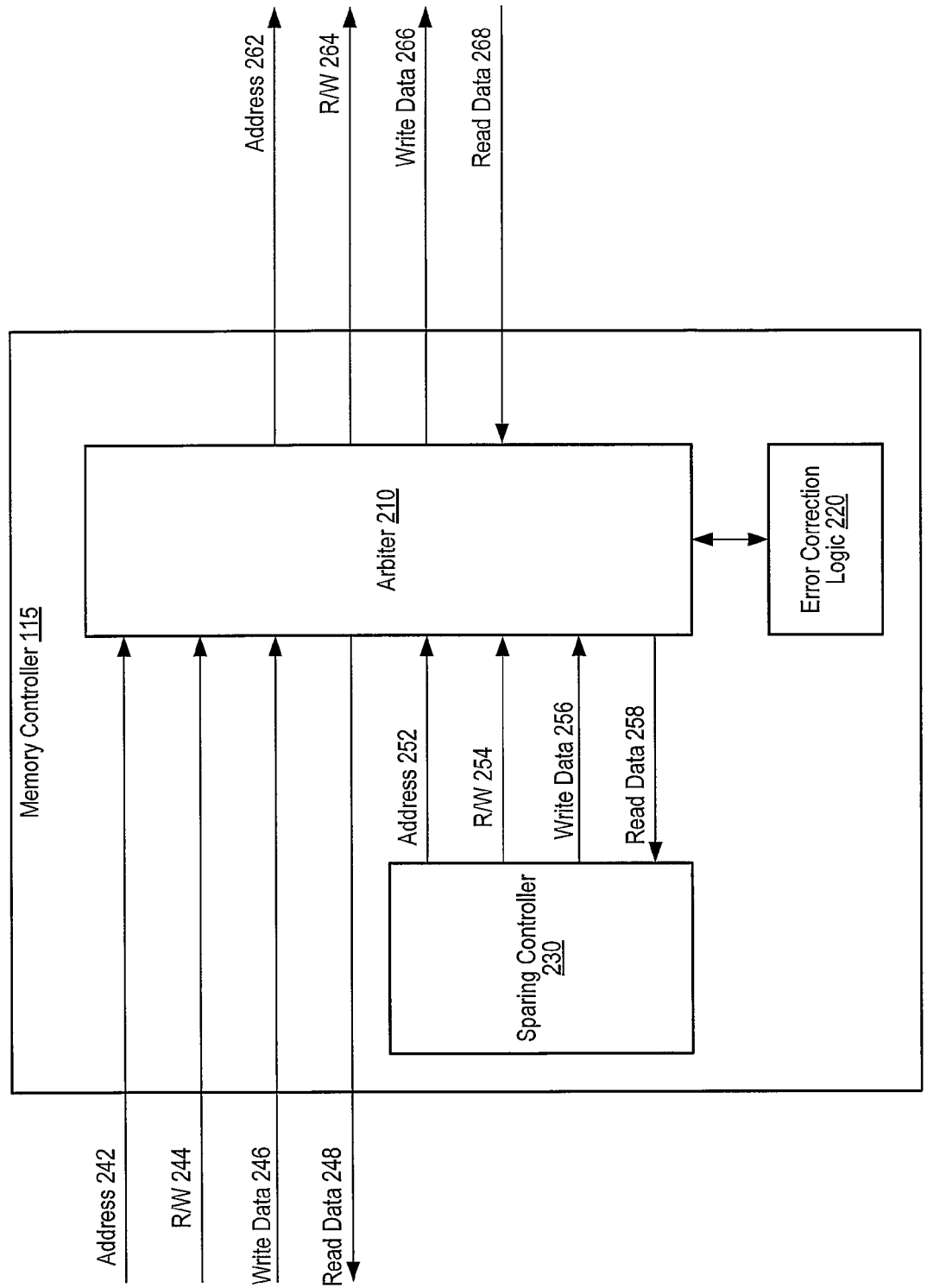
FIG. 2 is a generalized block diagram of one embodiment of a memory controller.

FIG. 2 is a generalized block diagram of one embodiment of memory controller 115. In the illustrated embodiment, memory controller 115 includes an arbiter 210 coupled to error correction logic 220 and a sparing controller 230. Arbiter 210 receives memory requests from a host and from sparing controller 230, arbitrates among the requests, and conveys requests to the appropriate memory chips. Memory requests received from a host may be queued prior to transmission to arbiter 210. Generally speaking, memory requests may be any attempts to read data from, or write data to, one or more of memory modules 120. Memory requests received from a host may include address 242, R/W 244, and either write data 246 or read data 248. Memory requests received from sparing controller 230 may include address 252, R/W 254, and either write data 256 or read data 258. In one embodiment, arbiter 210 may include a queuing function for queuing memory requests from both a host and sparing controller 230 to prevent requests from colliding or being dropped. Memory requests conveyed by arbiter 210 may include address 262, R/W 264, and either write data 266 or read data 268. In the illustrated embodiment, addresses, read data, and write data are shown as separate connections. In alternative embodiments, address and data connections may be shared and read and write data may share a bidirectional connection. More specifically, in one embodiment address and data may be sent and received via a packetized interface where information is transferred in packets and the format of the packet determines the meaning of the information in the packet.

In general, arbiter 210 directs memory requests to a set of memory chips that includes one or more spare chips. Arbiter 210 may interpret the data sent to or received from the requested set of memory chips according to which chips are considered to be spares and which are non-spares. More specifically, address 242, R/W 244, and write data 246 or read data 248 may be conveyed to the requested memory chips via address 262, R/W 264, and write data 266 or read data 268 respectively. Data may be stored in memory chips using an encoding that includes error correction or check bits. During a read transaction, arbiter 210 may send the data received from non-spare chips to error correction logic 220, which may evaluate the error correction bits. If an error is indicated, error correction logic 220 may correct the error and send the resulting corrected data back to arbiter 210. If an error is not indicated, error correction logic 220 may send the uncorrected data back to arbiter 210. Arbiter 210 may forward the data returned from error correction logic 220 to the requesting host as read data 248. During a write transaction, arbiter 210 may write data to a targeted set of memory chips where the valid data is written to the non-spare chips.

The operation of error correction logic 220 described above may be sufficient to correct infrequent or occasional memory chip errors. However, if the number of errors exceeds a pre-determined threshold value, memory controller 115 may handle errors according to an alternative chip-sparing process. For example, if an error occurs several times at the same memory location, error checking logic may initiate the chip-sparing process. In alternative embodiments, software executing on host 110 may initiate the chip-sparing process. Initially, when chip sparing is desired, the contents of a failed memory chip are read, corrected if necessary, and written to a spare memory chip through a sequence of paired read/write transactions. In some embodiments, the identity of the failed chip may be passed to the error correction logic for use in improving its error correction capabilities. Subsequently, once the spare chip has received the entire contents of the failed chip, memory requests (either reads or writes) directed to an address that includes the failed memory chip may be mapped to an alternative set of memory chips. Data returned from the alternative set of memory chips may be sent to error correction logic 220 and handled as described above. Memory controller 115 may continue to apply conventional error correction techniques to other memory chips before, during, and after a chip-sparing process. Once a failing chip has been spared, since error correction logic 220 will detect fewer errors in data from the spare memory chip than would be detected in data from the failing memory chip, fewer error correction operations will be needed. Consequently, error correction circuitry within error correction logic 220 may be able to correct errors from other memory chips. In some embodiments, chip sparing may be performed on one or more portions and not on other portions of a failed chip. In these embodiments, transactions directed to the spared portions of the failed chip may be re-directed to the spare chip, while transactions directed to the non-spared portions of the failed chip may be unaffected.

During the period in which the contents of the failed chip are being copied to the spare chip, non-sparing transactions may be allowed provided arbiter 210 follows certain procedures to prevent data corruption, as described further below. In one embodiment, sparing controller 230 may manage the sparing process, issuing a sequence of paired read/write requests. During the sparing process, the address of the memory location being spared may be referred to as the bound address. Sparing controller 230 may set the bound address to one extreme of the address range of the failed memory chip at the beginning of the sparing operation and as the sparing operation proceeds, progressively advance the bound address toward the other extreme of the address range until the entire contents of the failed memory chip have been remapped to the spare memory chip. During the sparing operation, arbiter 210 may determine how to handle a memory request from the host depending on a comparison of the values of address 242 and the bound address, and if the request is a read request or a write request. The procedures followed by arbiter 210 are described in further detail below.

Figure 3:
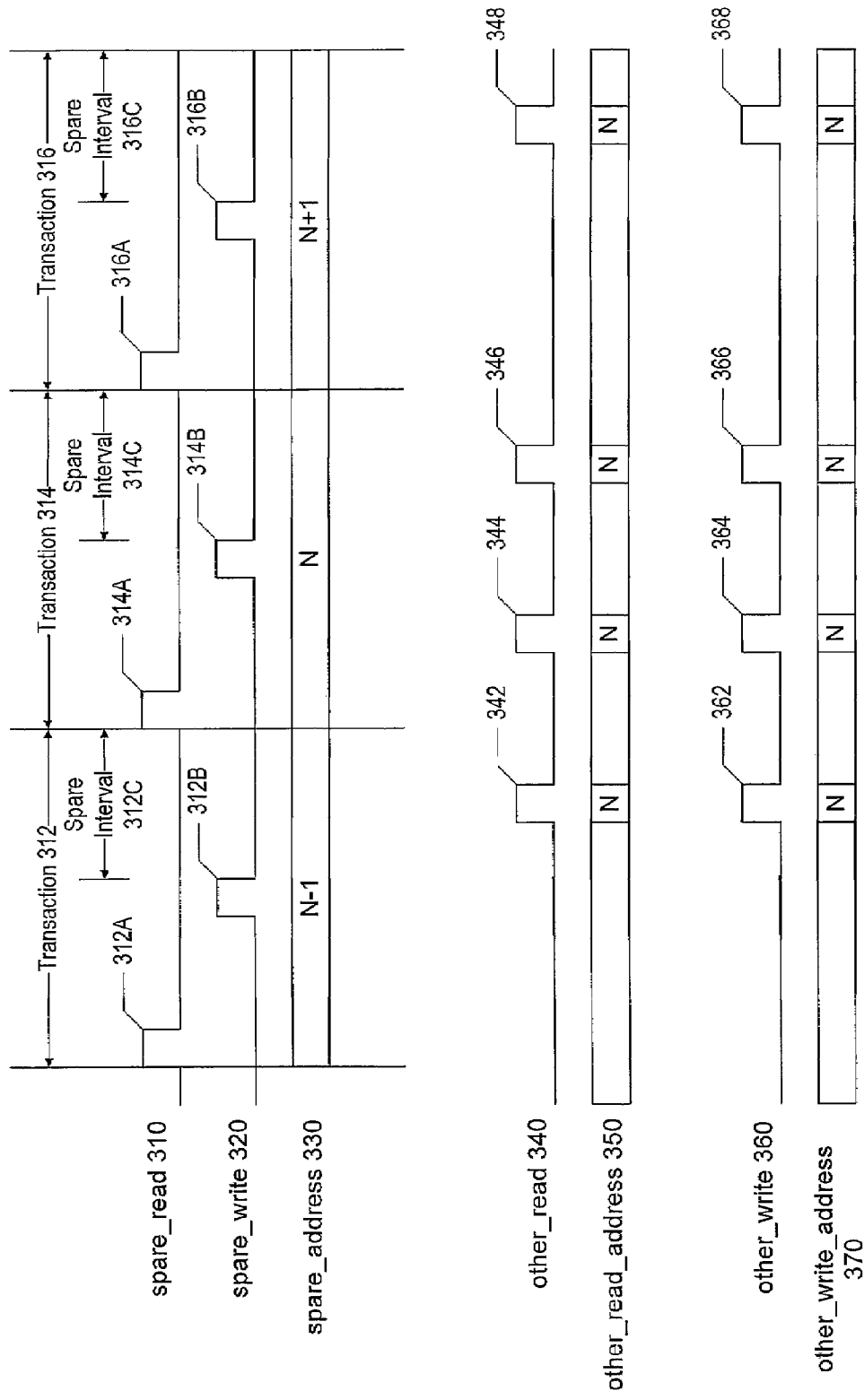
FIG. 3 illustrates the timing of signals received by an arbiter during a chip sparing process.

FIG. 3 illustrates the timing of signals received by arbiter 210 during a chip sparing process. Three timing waveforms, spare_read 310, spare_write 320, and spare_address 330 illustrate a portion of a sequence of paired read/write transactions that may be used to remap data from a failed memory chip to a spare memory chip. Two timing waveforms, other_read 340 and other_read_address 350 illustrate read operations that occur during, but are not part of the chip sparing process. Similarly, two timing waveforms, other_write 360 and other_write_address 370 illustrate write operations that occur during, but are not part of the chip sparing process.

The illustrated portion of the sequence of paired read/write transactions includes transactions 312, 314, and 316, each associated with a respective one of three consecutive memory locations having addresses designated N-1, N, and N+1. Accordingly, the bound addresses during transactions 312, 314, and 316 are N-1, N, and N+1 respectively. Transaction 312 begins with read request 312A followed by write request 312B. Upon completion of write request 312B, a spare interval 312C is enforced before the next read/write transaction begins. During spare interval 312C, sparing may be halted and other memory transactions may be permitted. Transactions 314 and 316 include read requests, write requests, and spare intervals similar to those of transaction 312, as shown.

During transaction 312, the bound address has a value of N-1 and a read or a write request directed to any other address may be allowed without risk of data corruption. Consequently, arbiter 210 may be configured to allow read and write requests during any portion of transaction 312 to any address other than N-1. For example, read request 342 associated with address N or write request 362 associated with address N may be allowed. Similarly, read request 348 associated with address N and write request 368 associated with address N may be allowed during any portion of transaction 316 without risk of data corruption since transaction 316 is associated with address N+1. However, since transaction 314 is associated with address N, arbiter 210 may follow a different policy to avoid data corruption. For example, write request 364, associated with address N, occurs after read request 314A and before write request 314B. If write request 364 is allowed, then write request 314B may overwrite the data written by write request 364, resulting in data corruption. To avoid this data corruption, arbiter 210 may be configured to block write request 364, but allow write request 366, which occurs during spare interval 314C. Also, read request 344, associated with address N, occurs after read request 314A and before write request 314B. Arbiter 210 may be configured to block read request 344, but allow read request 346, which is preferred because it occurs during spare interval 314C, when data from the location indicated by address N may be read from the spare chip instead of the failed chip. However, in order to block read request 344 but not block read request 346, arbiter 210 may require additional control information beyond the values of spare_address 330 and other_read_address 350 such as a flag indicating the start of spare interval 314C. In an alternative embodiment, both read requests 344 and 346 may be allowed, although read request 344 may be fulfilled by data from the failed memory chip that may require error correction. In summary, arbiter 210 may be configured to block either non-sparing read or non-sparing write requests to the location indicated by the bound address during the sparing operation between the start of the sparing read request and completion of the sparing write request.

In one embodiment, spare intervals such as 312C, 314C, and 316C may have a fixed duration. Alternatively, spare intervals may have a configurable duration. For example, the duration of spare intervals may be determined by memory controller 115 based on the frequency of other memory transactions. At times when non-sparing read or non-sparing write requests are frequent or bursty, it may be desirable to reduce transaction delays and longer spare intervals may be configured. At other times when the memory system is relatively idle, it may be desirable to finish a sparing operation quickly and shorter spare intervals may be configured.

Figure 4:
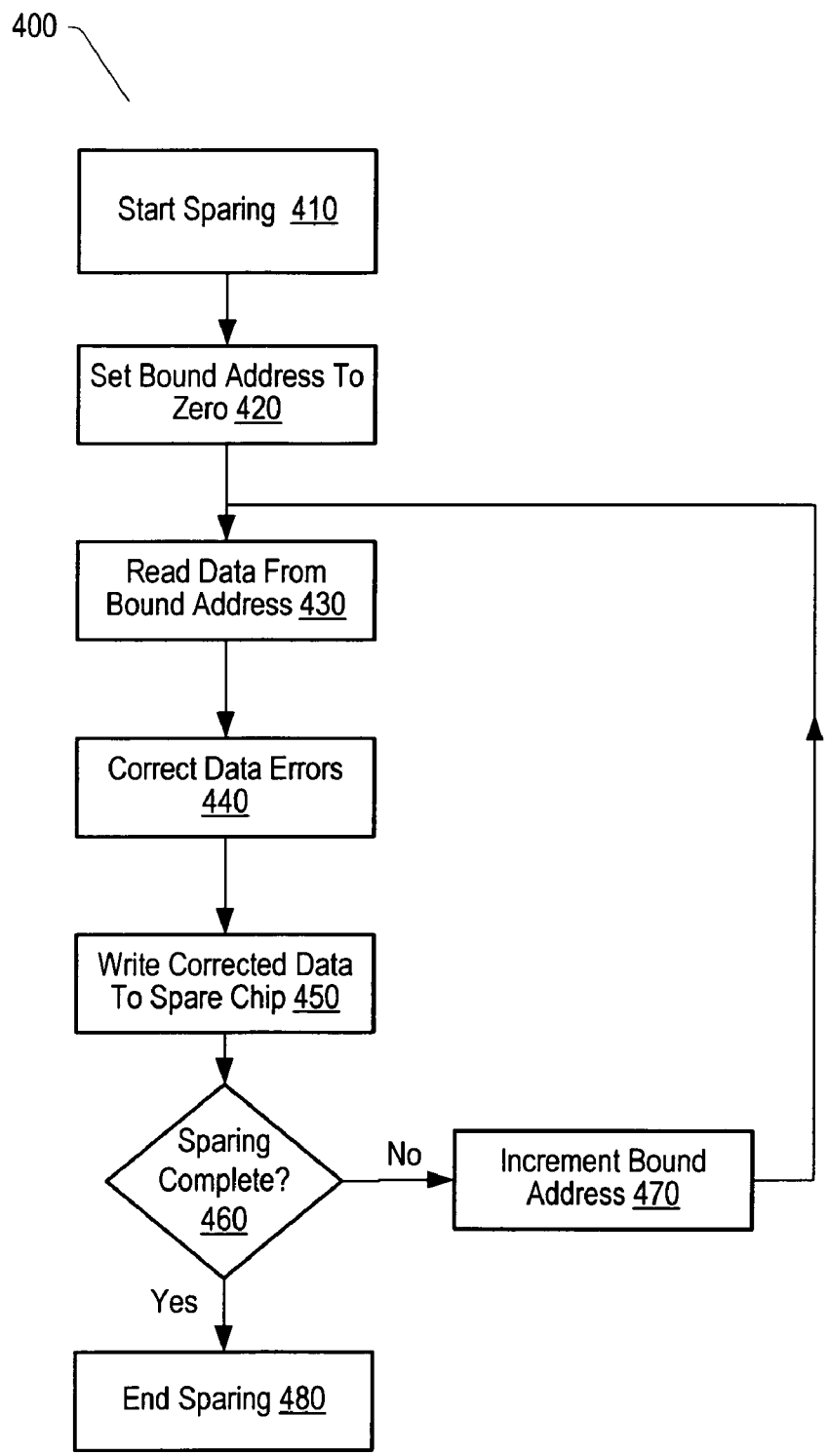
FIG. 4 illustrates one embodiment of a sparing process that may be used to remap a failed memory chip to a spare memory chip.

FIG. 4 illustrates one embodiment of a sparing process 400 that may be used to remap a failed memory chip to a spare memory chip. In the illustrated embodiment, a sparing operation is used to spare an entire memory chip and consists of a series of individual sparing transactions, one for each memory address. Sparing begins when failures of a given memory chip exceed a threshold value or as otherwise determined by software executing on host 110 (block 410). Next, the value of a bound address may be set to the lowest address of the failed memory (block 420) and data read from the location indicated by the bound address (block 430). Once the data has been read, errors may be corrected (block 440), such as through the use of error-correcting codes. Corrected data may then be written to a spare memory chip (block 450). If the value of the bound address is not equal to the highest address of the failed memory (decision block 460), the bound address may be incremented (block 470) and data may be read from the location indicated by the next address (block 430). Once the bound address determined to have reached the highest address of the failed memory (decision block 460), sparing is completed (block 480).

Figure 5:
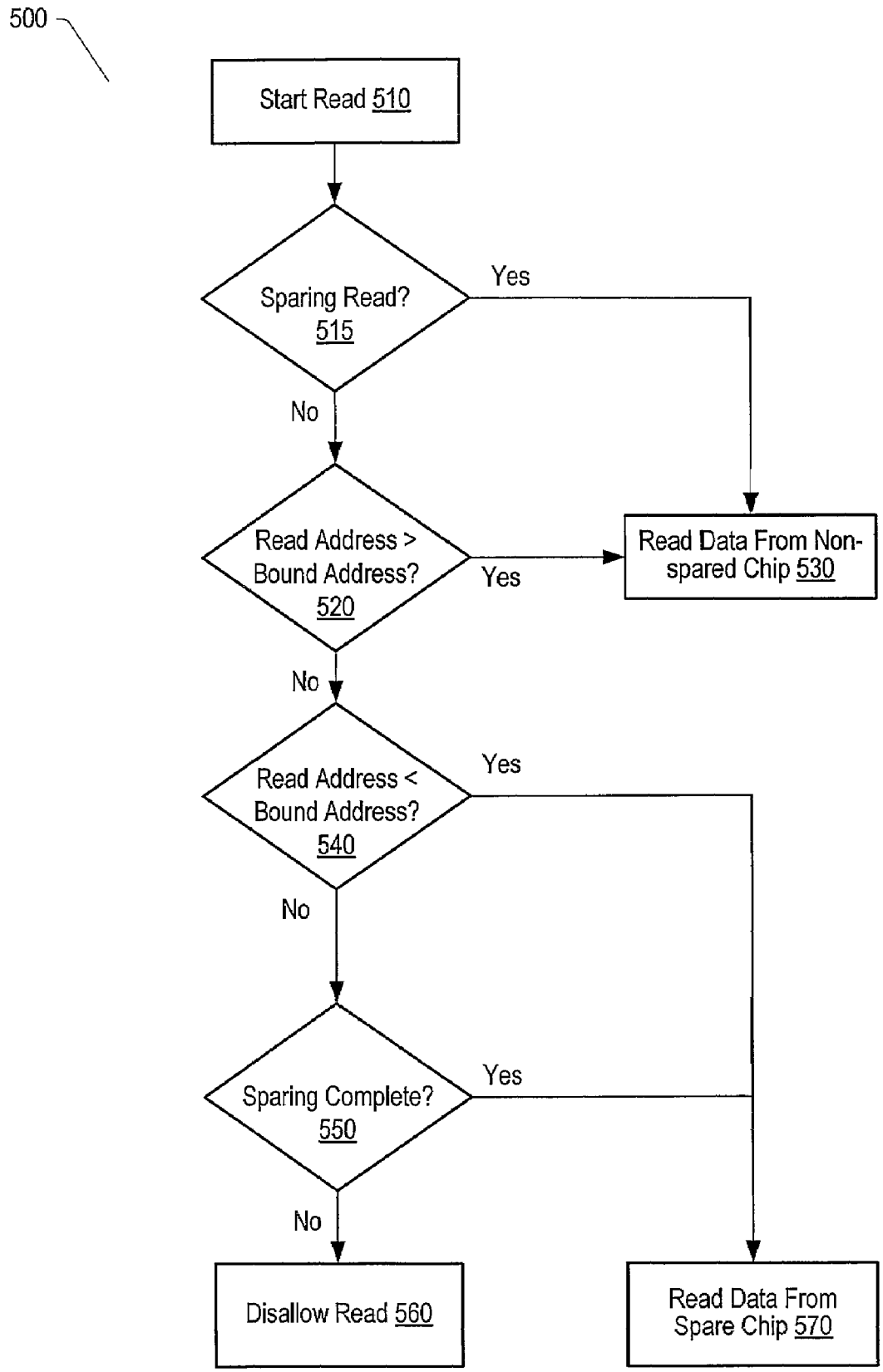
FIG. 5 illustrates one embodiment of a process that may be used to handle read requests during a chip sparing operation.

FIG. 5 illustrates one embodiment of a process 500 that may be used to handle read requests during a chip sparing operation. A read request may be initiated at any time (block 510). If the read request is a sparing request (decision block 515), then data may be read from the location indicated by the requested address including data from the failed chip and errors may be corrected (block 530). If the read request is a non-sparing request and the address is greater than the bound address (decision block 520), data may be read from the location indicated by the requested address including data from the failed (non-spared) chip and if errors are detected, they may be corrected (block 530). If the address of the non-sparing read request is not greater than the bound address (decision block 520), and if the address of the non-sparing read request is less than the bound address (decision block 540), then data may be read from the location indicated by the requested address including data from the spare chip to which the data from the failed chip has been mapped (block 570). If errors are detected in data from the spare chip, they may be corrected. Also, if the address of the non-sparing read request is neither greater than nor less than the bound address, i.e., they are equal (decision blocks 520 and 540) and the sparing transaction for the bound address is complete (decision block 550), then data may be read from the location indicated by the requested address including data from the spare chip to which the data from the failed chip has been mapped (block 570). If errors are detected in data from the spare chip, they may be corrected. If the address of the non-sparing read request is neither greater than nor less than the bound address, i.e., if they are equal (decision block 520 and 540), and if the sparing transaction for the bound address is not complete (decision block 550), then the read request may be disallowed (block 560).

Figure 6:
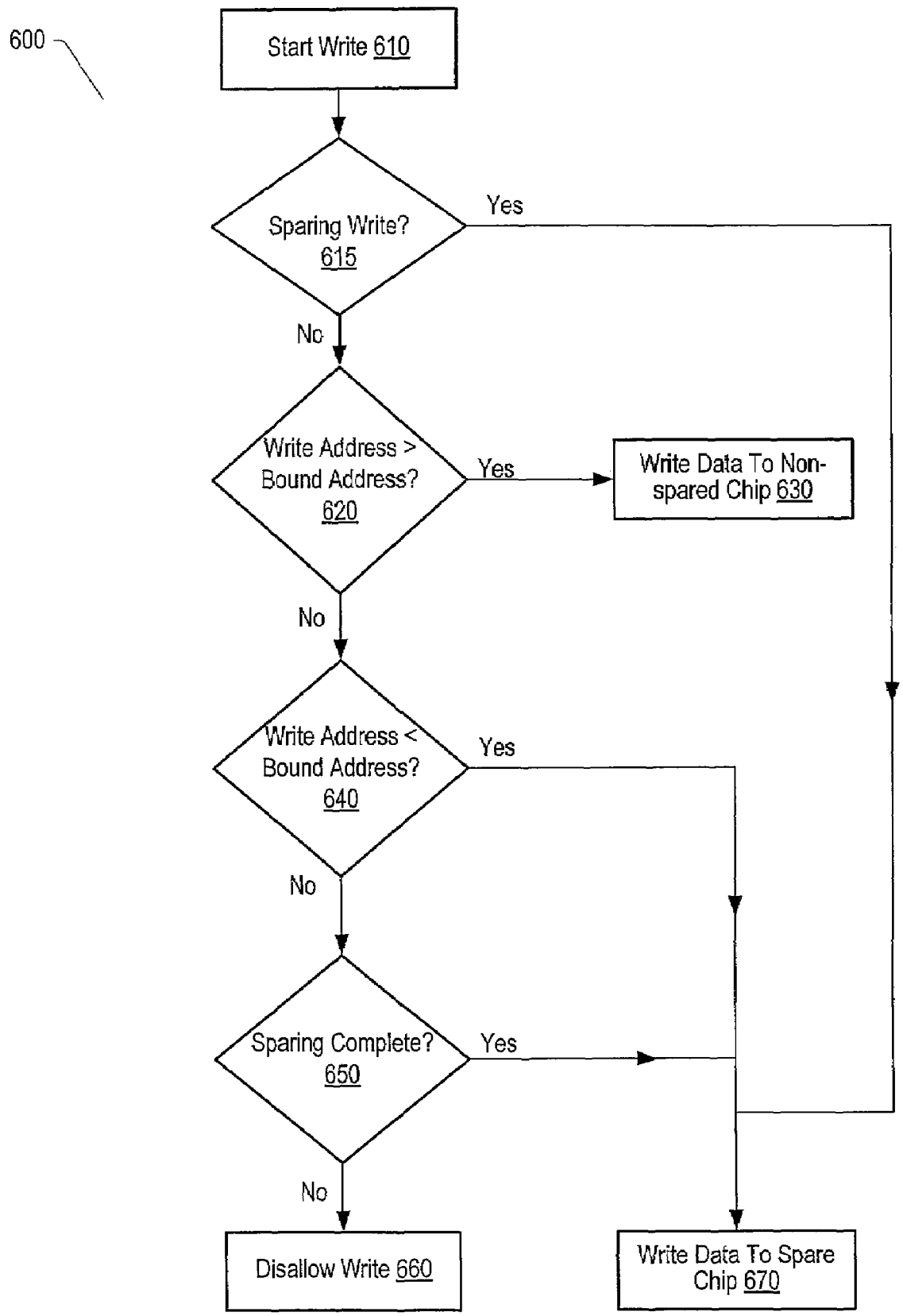
FIG. 6 illustrates one embodiment of a process that may be used to handle write requests during a chip sparing operation.

FIG. 6 illustrates one embodiment of a process 600 that may be used to handle write requests during a chip sparing operation. A write request may be initiated at any time (block 610). If the write request is a sparing request (decision block 615) then data may be written to the location indicated by the requested address including the spare chip (block 670). If the write request is a non-sparing request and the address is greater than the bound address (decision block 620), data may be written directly to the location indicated by the requested address including the failed (non-spared) chip (block 630), since the data in this location has not yet been mapped to the spare chip. If the address of the non-sparing write request is not greater than the bound address (decision block 620), and if the address of the non-sparing write request is less than the bound address (decision block 640), then data may be written to the location indicated by the requested address including to the spare chip to which the data of the requested address in the failed chip has been mapped (block 670). In some embodiments, data may be written to both the spare chip and the failed chip. Also, if the address of the non-sparing write request is neither greater than nor less than the bound address, i.e., they are equal (decision blocks 620 and 640) and the sparing transaction for the bound address is complete (decision block 650), then data may be written to the location indicated by the requested address including to the spare chip to which the data of the requested address in the failed chip has been mapped (block 670). If the address of the non-sparing write request is neither greater than nor less than the bound address, i.e., they are equal (decision block 620 and 640), and if the sparing transaction for the bound address is not complete (decision block 650), then the write request may be disallowed (block 660).

It is noted that the above-described embodiments may comprise software. For example, the functionality of memory controller 115 may be implemented in hardware, software, firmware, or some combination of the above. In such embodiments, the program instructions which implement the methods and/or mechanisms may be conveyed or stored on a computer readable medium. Numerous types of media which are configured to store program instructions are available and include hard disks, floppy disks, CD-ROM, DVD, flash memory, programmable ROMs (PROM), random access memory (RAM), and various other forms of volatile or non-volatile storage.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
   reading data from a given location of one or more of a plurality of memory chips including a first memory chip, wherein each of the plurality of memory chips is configured to store data at a plurality of locations;
   writing the data read from the given location of the one or more of the plurality of memory chips including a first memory chip to the given location of one or more of the plurality of memory chips including a second memory chip, wherein during said writing, data from the first memory chip is written to the second memory chip; and
   allowing additional memory transactions directed to the plurality of memory chips between a start of said reading and an end of said writing unless the additional memory transaction is targeted to the given location.

2. The method of claim 1, further comprising correcting errors in the data prior to said writing the data.

3. The method of claim 2, wherein said reading, correcting, writing, and allowing are part of a sparing transaction, and wherein a sparing process comprises sequentially performing a sparing transaction for at least two of the plurality of locations of the plurality of memory chips.

4. The method of claim 3, further comprising allowing additional memory transactions directed to the plurality of memory chips for a configurable period of time after a just completed writing and before starting a subsequent sparing transaction.

5. The method of claim 3, further comprising writing data to the second chip in response to determining that an additional write transaction is directed to a location in the first memory chip from which data has already been read and written to the second memory chip.

6. The method of claim 3, further comprising reading data from the second memory chip in response to determining that an additional read transaction is directed to a location in the first memory chip from which data has already been read and written to the second memory chip.

7. The method of claim 6, further comprising if the additional read transaction is directed to a location in the first memory chip from which data has not already been read and written to the second memory chip:
   reading data from the first memory chip; and
   correcting errors in the data read from the first memory chip.

8. A system comprising:
   a memory controller interconnected to a plurality of memory chips, wherein each memory chip is configured to store data at a plurality of locations, and wherein the memory controller is configured to perform a sparing transaction comprising:
   reading data from a given location of one or more of the plurality of memory chips including a first memory chip;
   writing the data read from the given location of the one or more of the plurality of memory chips including a first memory chip to the given location of one or more of the plurality of memory chips including a second memory chip, wherein during said writing, data from the first memory chip is written to the second memory chip; and
   allowing additional memory transactions directed to the plurality of memory chips between a start of said reading and an end of said writing unless the additional memory transaction is targeted to the given location.

9. The system of claim 8, wherein said sparing transaction further comprises correcting errors in the data prior to said writing the data.

10. The system of claim 9, wherein said reading, correcting, writing, and allowing are part of a sparing transaction, and wherein a sparing process comprises sequentially performing a sparing transaction for at least two of the plurality of locations of the plurality of memory chips.

11. The system of claim 10, wherein the memory controller is further configured to allow additional memory transactions directed to the plurality of memory chips for a configurable period of time after a just completed writing and before starting a subsequent sparing transaction.

12. The system of claim 10, wherein the memory controller is further configured to write data to the second chip in response to determining that an additional write transaction is directed to a location in the first memory chip from which data has already been read and written to the second memory chip.

13. The system of claim 10, wherein the memory controller is further configured to read data from the second memory chip in response to determining that an additional read transaction is directed to a location in the first memory chip from which data has already been read and written to the second memory chip.

14. The system of claim 13, wherein if the additional read transaction is directed to a location in the first memory chip from which data has not already been read and written to the second memory chip, the memory controller is further configured to:
 read data from the first memory chip; and
 correct errors in the data read from the first memory chip.

15. A memory controller for communicating with a plurality of memory chips, wherein each memory chip is configured to store data at a plurality of locations, and wherein the memory controller is configured to perform a sparing transaction comprising:
 reading data from a given location of one or more of the plurality of memory chips including a first memory chip;
 writing the data read from the given location of the one or more of the plurality of memory chips including a first memory chip to the given location of one or more of the plurality of memory chips including a second memory chip, wherein during said writing, data from the first memory chip is written to the second memory chip; and
 allowing additional memory transactions directed to the plurality of memory chips between a start of said reading and an end of said writing unless the additional memory transaction is targeted to the given location.

16. The memory controller of claim 15, wherein said sparing transaction further comprises correcting errors in the data prior to said writing the data.

17. The memory controller of claim 16,
 wherein said reading, correcting, writing, and allowing are part of a sparing transaction;
 wherein a sparing process comprises sequentially performing a sparing transaction for at least two of the plurality of locations of the plurality of memory chips; and
 wherein the memory controller is further configured to allow additional memory transactions directed to the plurality of memory chips for a configurable period of time after a just completed writing and before starting a subsequent sparing transaction.

18. The memory controller of claim 17, wherein the memory controller is further configured to write data to the second chip in response to determining that an additional write transaction is directed to a location in the first memory chip from which data has already been read and written to the second memory chip.

19. The memory controller of claim 17, wherein the memory controller is further configured to read data from the second memory chip in response to determining that an additional read transaction is directed to a location in the first memory chip from which data has already been read and written to the second memory chip.

20. The memory controller of claim 19, wherein if the additional read transaction is directed to a location in the first memory chip from which data has not already been read and written to the second memory chip, the memory controller is further configured to:
 read data from the first memory chip; and
 correct errors in the data read from the first memory chip.

* * * * *